United States Patent
Bussa

(10) Patent No.: US 9,538,678 B2
(45) Date of Patent: Jan. 3, 2017

(54) VOLTAGE CONTROLLER FOR AN ELECTRIC COOLING FAN

(71) Applicant: Johnson Electric S.A., Murten (CH)

(72) Inventor: Marco Bussa, Asti (IT)

(73) Assignee: JOHNSON ELECTRIC S.A., Murten (CH)

( * ) Notice: Subject to any disclaimer, the term of this patent is extended or adjusted under 35 U.S.C. 154(b) by 29 days.

(21) Appl. No.: 14/604,364

(22) Filed: Jan. 23, 2015

(65) Prior Publication Data

US 2015/0208540 A1  Jul. 23, 2015

(30) Foreign Application Priority Data

Jan. 23, 2014 (IT) .......................... TO2014U0012 U

(51) Int. Cl.
| | | |
|---|---|---|
| *H05K 7/02* | (2006.01) | |
| *F04D 19/00* | (2006.01) | |
| *F04D 25/06* | (2006.01) | |
| *H05K 5/02* | (2006.01) | |

(52) U.S. Cl.
CPC .............. *H05K 7/02* (2013.01); *F04D 19/002* (2013.01); *F04D 25/06* (2013.01); *F04D 25/068* (2013.01); *H05K 5/0247* (2013.01)

(58) Field of Classification Search
CPC ....... H05K 5/0247; H05K 7/02; F04D 25/068; F04D 19/002; F04D 25/06
USPC .................................. 361/707, 723, 772, 813
See application file for complete search history.

(56) References Cited

U.S. PATENT DOCUMENTS

| | | | | |
|---|---|---|---|---|
| 4,591,950 A | * | 5/1986 | Houpt ...................... | H01R 4/34 174/541 |
| 5,751,058 A | * | 5/1998 | Matsuki ................ | H01L 25/072 257/678 |
| 6,147,868 A | * | 11/2000 | Boutillier .............. | H01L 25/072 257/707 |
| 6,234,842 B1 | * | 5/2001 | Keay ...................... | H01R 4/646 361/707 |
| 6,236,557 B1 | | 5/2001 | Kashihara et al. | |
| 6,912,134 B2 | * | 6/2005 | Grant .................. | H05K 7/20209 257/666 |
| 7,085,138 B2 | | 8/2006 | Origlia | |
| 7,244,141 B2 | * | 7/2007 | Yamane ................. | H05K 7/026 361/719 |
| 2003/0081394 A1 | * | 5/2003 | Enomoto ............... | H01R 12/68 361/777 |
| 2011/0249413 A1 | * | 10/2011 | Bussa .................... | F04B 49/007 361/752 |
| 2013/0155619 A1 | * | 6/2013 | Bussa .................... | H05K 5/006 361/707 |

* cited by examiner

*Primary Examiner* — Adrian S Wilson
*Assistant Examiner* — Abhishek Rathod
(74) *Attorney, Agent, or Firm* — Muncy, Geissler, Olds & Lowe, P.C.

(57) ABSTRACT

A voltage controller has an electrically insulating supporting structure provided with a plurality of electrical connecting terminals. At least one of the terminals has a flexible blade of elongate shape which protrudes inside the structure where a distal end portion of the blade is connected to a circuit housed therein. The supporting structure has a protective formation with at least one strip which has a shape corresponding to that of the blade and which extends in superimposition on this blade.

13 Claims, 6 Drawing Sheets

VOLTAGE CONTROLLER FOR AN ELECTRIC COOLING FAN

CROSS REFERENCE TO RELATED APPLICATIONS

This non-provisional patent application claims priority under 35 U.S.C. §119(a) from Utility Model Application No. TO 2014 U 000012 filed in Italy on Jan. 23, 2014, the entire contents of which are hereby incorporated by reference.

FIELD OF THE INVENTION

This invention relates to a voltage controller for an electric cooling fan, particularly for a heat exchanger of a motor vehicle.

BACKGROUND OF THE INVENTION

More specifically, the invention proposes a voltage controller of the type comprising a supporting structure of electrically insulating material, at one end of which there is provided a plurality of electrical connecting terminals, at least one of which comprises a flexible blade of elongate shape which protrudes inside said structure where a distal end portion of the blade is connected to a circuit housed therein.

One problem with this type of arrangement is that the flexing of the flexible blade is not controlled during assembly which can lead to imprecise positioning of the blade requiring additional solder to ensure a good electrical connection.

SUMMARY OF THE INVENTION

Thus there is a desire for a voltage controller of this type, the structure of which allows more precise location of said at least one flexible blade, better control of its bending during assembly, and better execution of its soldered connection, reducing the amount of added material (solder alloy) used.

Accordingly, in one aspect thereof, the present invention provides a voltage controller for an electric cooling fan, comprising a supporting structure of electrically insulating material, provided with a plurality of electrical connecting terminals, at least one of which comprises a flexible blade of elongate shape which protrudes inside the supporting structure where a distal end portion of the blade is connected to a circuit housed therein, wherein the supporting structure has a protective formation comprising at least one strip which has a shape corresponding to that of the blade and which extends in superimposition on the blade.

Preferably, the protective formation comprises a pair of strips which have a shape corresponding to that of the blade and which extend on opposite sides adjacent to the blade.

Preferably, a distal end of the blade comprises a portion bent at an angle towards the circuit, and the protective formation comprises a terminal part which at least partially surrounds the bent portion.

Preferably, the at least one strip of the protective formation is flexible.

Preferably, the supporting structure is made at least partially of molded plastic material, and the protective formation is made in one piece with the structure.

Preferably, the protective formation is directly molded to the blade.

According to a second aspect, the present invention provides an electric cooling fan for a heat exchanger of a motor vehicle, incorporating the above voltage controller.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Figure 1:
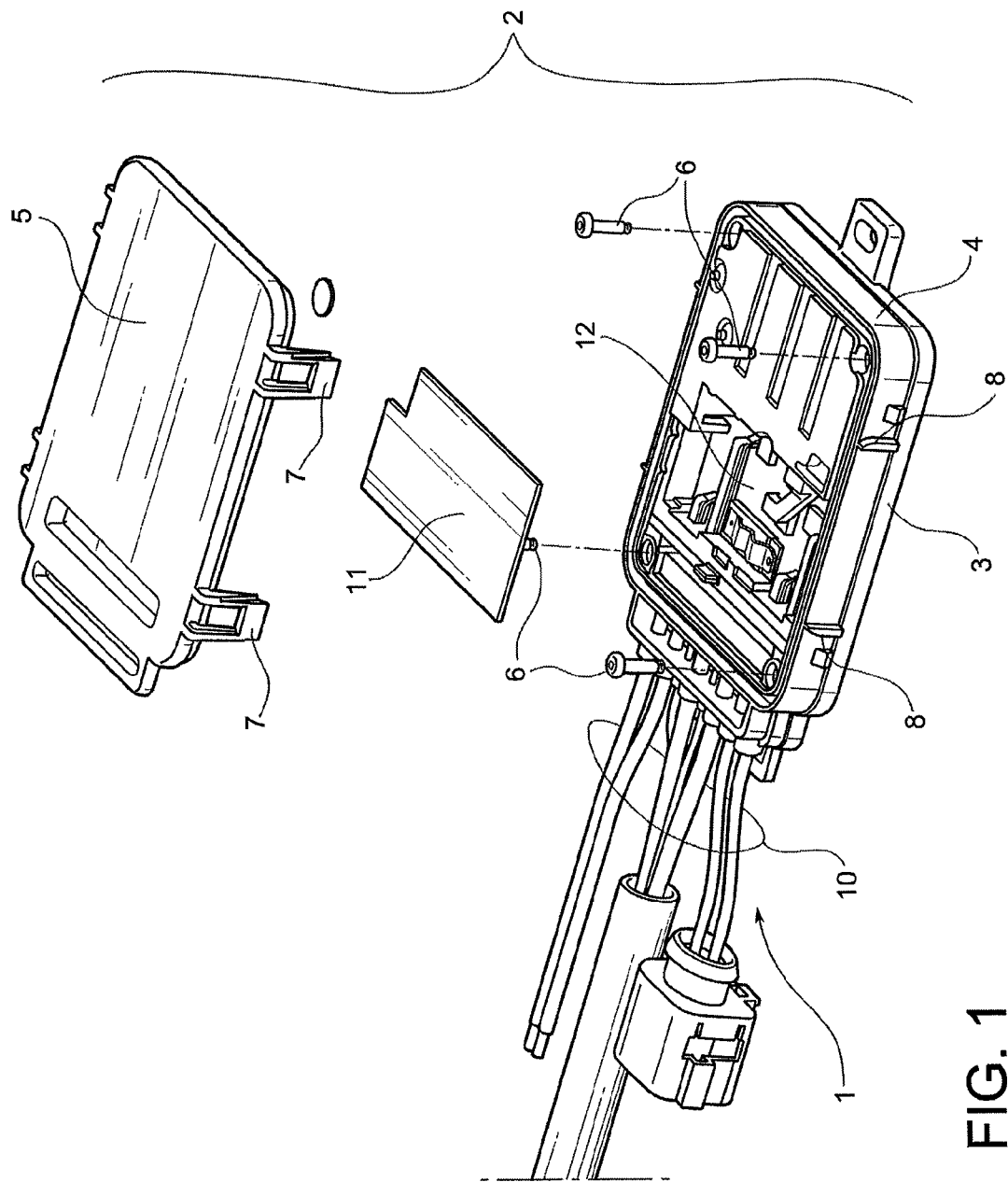
FIG. 1 is a partially exploded, perspective view of a voltage controller according to the present invention.
Figure 2:
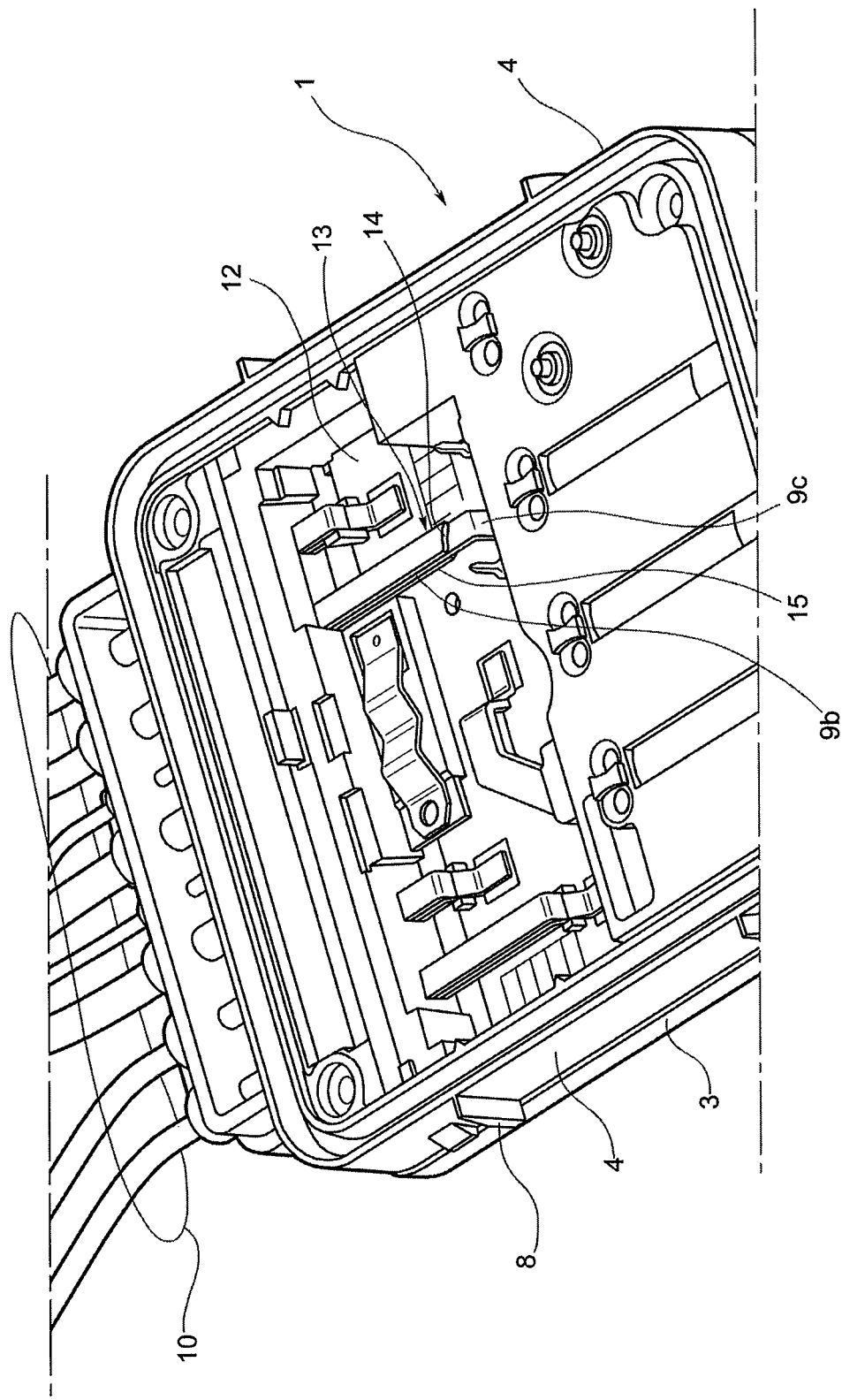
FIG. 2 is a partial, perspective view of the voltage controller according to FIG. 1.

In the drawings, the number 1 indicates the whole of a voltage controller according to the present invention. The voltage controller 1 comprises a support casing, indicated as a whole by 2. In the illustrated embodiment, the support casing 2 comprises a lower cover 3, an intermediate support frame 4 and an upper cover 5.

The intermediate frame 4 is fixed to the lower cover 3 by means of screws 6 (FIG. 1). The upper cover 5 is fixed to the intermediate frame 4 by means of a plurality of peripheral attachment formations 7, which engage in a snap-fit way with corresponding projecting retaining formations 8 of the intermediate frame.

At one end of the support frame 4 there is provided a plurality of electrical connecting terminals, in the form of shaped metal blades. These electrical terminals are indicated by 9 in FIG. 3, and respective insulated electrical conductors, indicated cumulatively by 10 in FIGS. 1 to 3 and 7, are connected to the terminals by soldering.

The electrical terminals 9 may conveniently be formed by cutting and bending from a single planar element of metallic material, and are partially embedded, by known methods, in the support frame 4, which is typically formed from a moulded plastic material.

With reference to FIGS. 1 to 4, a signal processing circuit, whose components are supported by a circuit board 11, and an electronic power circuit, whose components are supported by a circuit board indicated by 12, are housed in the support casing 2 of the voltage controller.

In the illustrated embodiment, the circuit boards 11 and 12 are positioned parallel to and facing one another.

Figure 3:
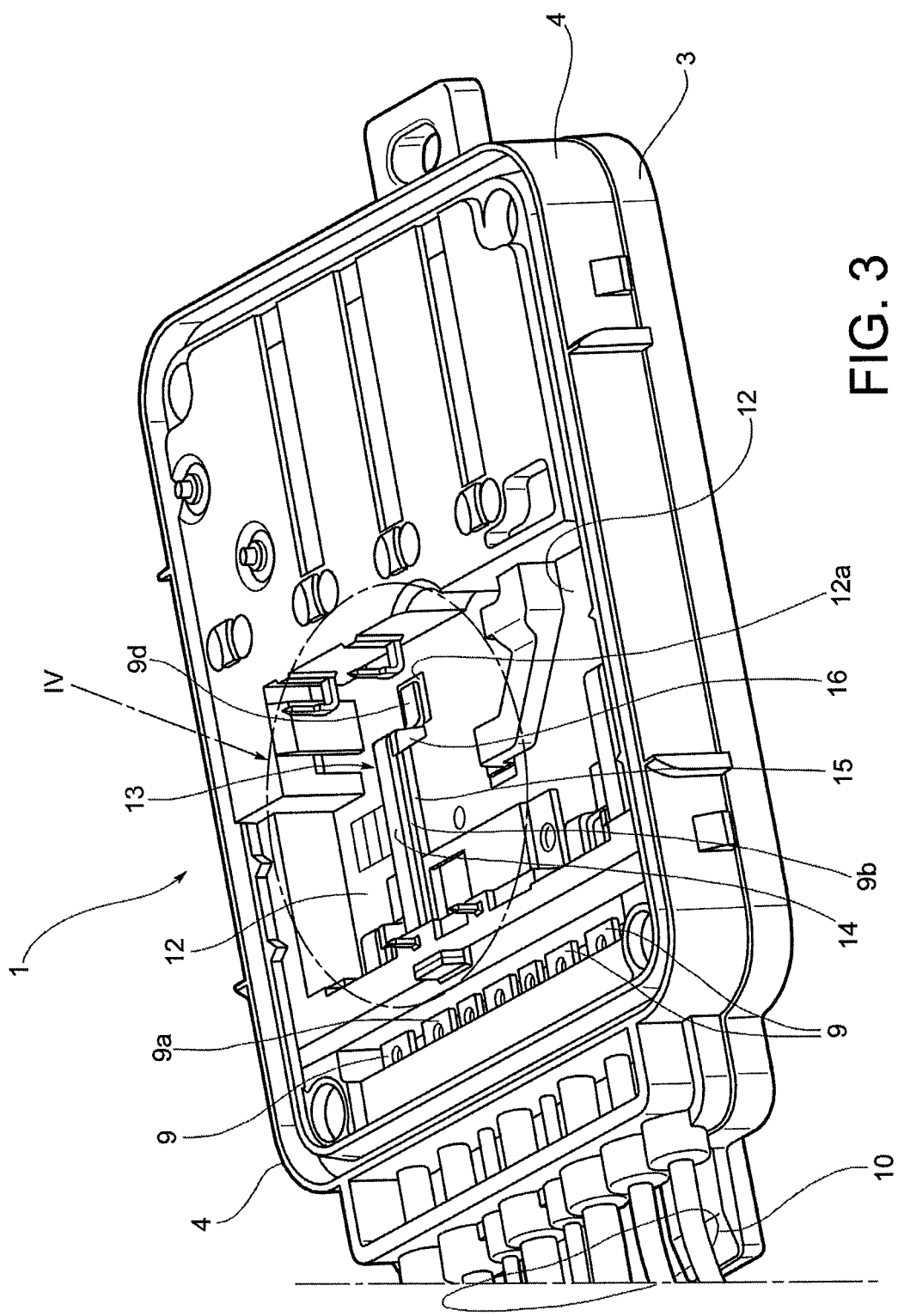
FIG. 3 is another partial, perspective view of the voltage controller according to the preceding figures.
Figure 4:
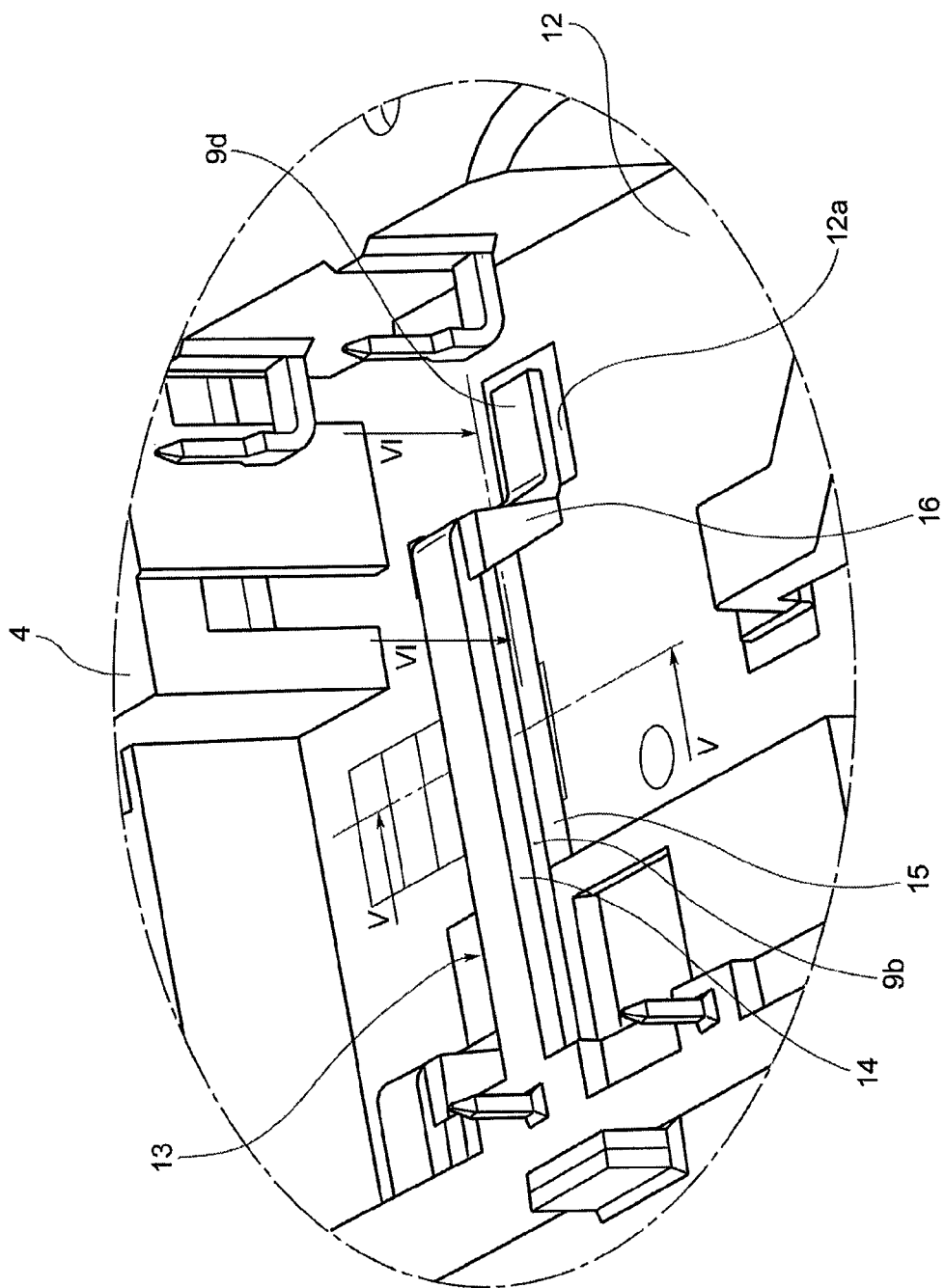
FIG. 4 is a perspective view, on an enlarged scale, of a portion of FIG. 3.
Figure 6:
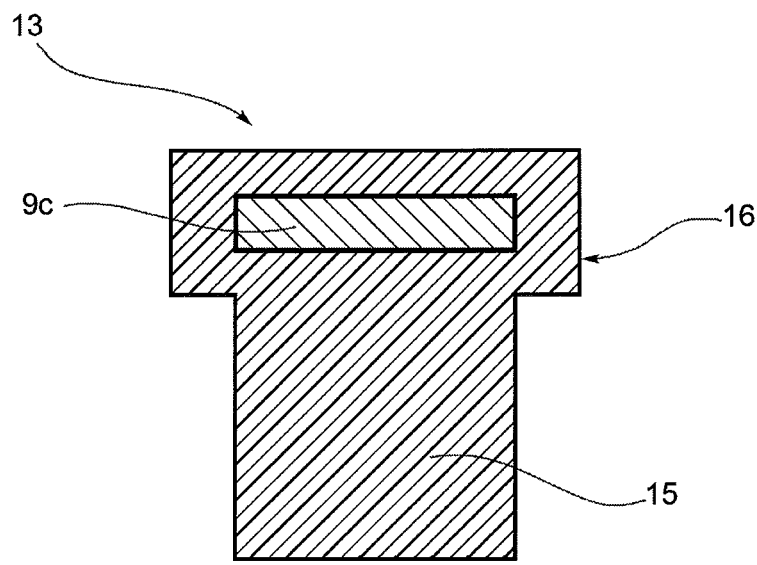
FIGS. 5 and 6 are partial, sectional views taken through the lines V-V and VI-VI respectively of FIG. 4.
Figure 7:
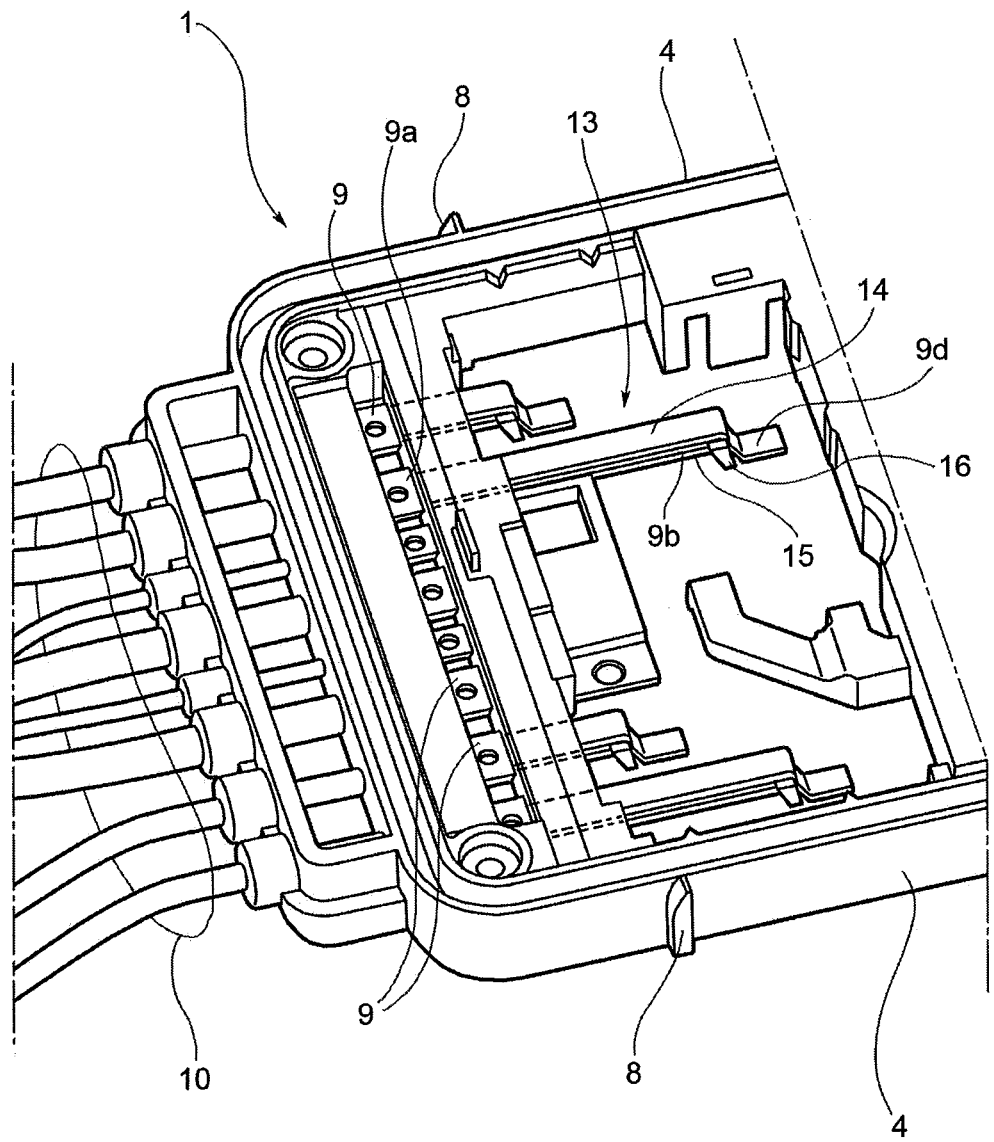
FIG. 7 is a partial, perspective view of an intermediate frame included in the voltage controller according to the preceding figures.

With particular reference to FIGS. 3, 4 and 7, some of the connecting terminals 9 comprise a respective flexible blade of elongate shape, which protrudes inside the support casing 2, particularly inside the frame 4, where an end portion of the blade is connected to the circuit board 12 housed therein.

Figure 5:
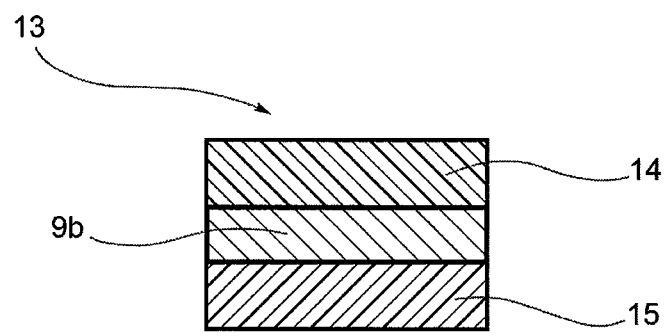

One of these connecting terminals is indicated by 9a in FIGS. 3 and 7. This terminal extends in the form of a flexible blade 9b of elongate shape which protrudes inside the support frame 4. This blade is associated with a protective formation, indicated as a whole by 13, which in the embodiment illustrated in the drawings comprises a pair of strips 14 and 15, forming upper and lower strips respectively, having a shape corresponding to that of the blade 9b and extending on opposite sides adjacent to this blade (see also FIG. 5).

The blade 9b comprises a distal portion 9c, bent down at an angle towards the circuit board 12 (FIG. 2), where it has a further bend which forms a terminal tab 9d soldered to a terminal or conductive spot 12a of the circuit board 12 (FIGS. 3, 4 and 7).

Conveniently, the protective formation 13 comprises a terminal part, indicated by 16 in FIGS. 3, 4, 6 and 7, which at least partially surrounds the bent portion 9c of the blade 9b.

The formation 13-16, as a whole, provides effective protection for the blade 9b, which is particularly useful during the assembly of the voltage controller 1.

The intermediate frame 4 of the support casing 2 is conveniently made of a moulded plastic material, and the protective formation 13-16 is conveniently made in one piece with this frame.

The strips 14 and 15 of the protective formation are conveniently provided with a degree of flexibility, to allow the blade 9b to bend during the assembly operations.

The terminal part 16 of the protective formation 13 advantageously makes it possible to prevent the upward movement of the solder alloy during the soldering of the terminal tab 9d to the circuit board 12. The formation of excessive bodies of solder alloy is thereby avoided.

The strips 14 and 15 of the protective formation 13 do not necessarily have to be straight, but as a general rule they are shaped so as to match the conductive blade to be protected by them.

The embodiments described above are provided by way of example only, and various other modifications will be apparent to persons skilled in the field without departing from the scope of the invention as defined by the appended claims.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The invention claimed is:

1. A voltage controller, comprising a supporting structure of electrically insulating material, provided with a plurality of electrical connecting terminals, at least one of which comprises a flexible blade of elongate shape which protrudes inside the supporting structure where a distal end portion of the blade is connected to a circuit housed therein,
    wherein the supporting structure has a protective formation comprising at least one strip which has a shape corresponding to that of said blade and which extends in superimposition on said blade and which covers at least one side of the said blade, except the distal end portion.

2. The voltage controller of claim 1, wherein said protective formation comprises a pair of strips which have a shape corresponding to that of said blade and which extend on opposite sides adjacent to said blade.

3. The voltage controller of claim 1, wherein a distal end of said blade comprises a portion bent at an angle towards said circuit, and the protective formation comprises a terminal part which at least partially surrounds said bent portion.

4. The voltage controller of claim 1, wherein said at least one strip of the protective formation is flexible.

5. The voltage controller of claim 1, wherein said supporting structure is made at least partially of molded plastic material, and said protective formation is made in one piece with said structure.

6. The voltage controller of claim 1, wherein the protective formation is directly molded to said blade.

7. An electric cooling fan for a heat exchanger of a motor vehicle, incorporating a voltage controller as defined in claim 1.

8. A voltage controller comprising a supporting structure of electrically insulating material, provided with a plurality of electrical connecting terminals, at least one of which comprises a flexible blade of elongate shape which protrudes inside the supporting structure where a distal end portion of the blade is connected to a circuit housed therein;
    wherein the supporting structure has a protective formation comprising at least one strip which has a shape corresponding to that of said blade and which extends in superimposition on said blade, the protective formation is made in one piece with said structure.

9. The voltage controller of claim 8, wherein said protective formation comprises a pair of strips which have a shape corresponding to that of said blade and which extend on opposite sides adjacent to said blade.

10. The voltage controller of claim 8, wherein a distal end of said blade comprises a portion bent at an angle towards said circuit, and the protective formation comprises a terminal part which at least partially surrounds said bent portion.

11. The voltage controller of claim 8, wherein said at least one strip of the protective formation is flexible.

12. The voltage controller of claim 8, wherein said supporting structure and said protective formation are made at least partially of molded plastic material.

13. The voltage controller of claim 8, wherein the protective formation is directly molded to said blade.

* * * * *